United States Patent
Lee et al.

(10) Patent No.: US 6,852,472 B2
(45) Date of Patent: Feb. 8, 2005

(54) POLYSILICON HARD MASK ETCH DEFECT PARTICLE REMOVAL

(75) Inventors: Chu-Sheng Lee, Tainan (TW); Tou-Yu Chen, Tainan (TW)

(73) Assignee: Taiwan Semiconductor Manufacturing Co., LTD, Hsin Chu (TW)

(*) Notice: Subject to any disclaimer, the term of this patent is extended or adjusted under 35 U.S.C. 154(b) by 100 days.

(21) Appl. No.: 10/272,655

(22) Filed: Oct. 17, 2002

(65) Prior Publication Data

US 2004/0081918 A1 Apr. 29, 2004

(51) Int. Cl.[7] .............................................. C03C 25/68
(52) U.S. Cl. ..................... 430/313; 430/311; 430/322; 438/736; 438/737; 438/743; 438/744; 216/96; 216/103; 216/104
(58) Field of Search ................................ 430/311, 313, 430/322; 438/736, 737, 743, 744; 216/96, 103, 104

(56) References Cited

U.S. PATENT DOCUMENTS 6,689,665 B1 * 2/2004 Jang et al. .................. 438/296
2003/0068886 A1 * 4/2003 Morgan ...................... 438/687

* cited by examiner

Primary Examiner—Mark F. Huff
Assistant Examiner—Daborah Chacko-Davis
(74) Attorney, Agent, or Firm—Tung & Associates

(57) ABSTRACT

The removal of defect particles that may be created during polysilicon hard mask etching, and that are embedded within the polysilicon layer, is disclosed. Oxide is first grown in the polysilicon layer exposed through the patterned hard mask layer, so that the defect particle becomes embedded within the oxide. Oxide growth may be accomplished by rapid thermal oxidation (RTO). The oxide is then exposed to an acidic solution, such as hydrofluoric (HF) acid, to remove the oxide and the embedded defect particle embedded therein.

20 Claims, 4 Drawing Sheets

POLYSILICON HARD MASK ETCH DEFECT PARTICLE REMOVAL

FIELD OF THE INVENTION

This invention relates generally to semiconductor fabrication, and more particularly to the hard mask etching of polysilicon that may be performed during such fabrication.

BACKGROUND OF THE INVENTION

There are four basic operations in semiconductor processing, layering, patterning, doping, and heat treatments. Layering is the operation used to add thin layers to the surface of a semiconductor wafer. Patterning is the series of steps that results in the removal of selected portions of the layers added in layering. Doping is the process that puts specific amounts of dopants in the wafer surface through openings in the surface layers. Finally, heat treatments are the operations in which the wafer is heated and cooled to achieve specific results. Of these basic operations, patterning is typically the most critical, creating the surface parts of the devices that make up a circuit on the semiconductor wafer.

In some types of semiconductor fabrication, a hard mask is used in addition to the customary photoresist for patterning. The photoresist is initially patterned, and then a hard mask under the photoresist is etched where exposed through the photoresist, to become correspondingly patterned. This is shown by reference to FIGS. 1A and 1B. In FIG. 1A, a semiconductor device 100 being fabricated includes a polysilicon layer 102, a hard mask layer 104, and a photoresist layer 106. The hard mask layer 104 has an upper layer 104a and a lower layer 104b. The upper layer 104a may be oxide (SiO$_2$), whereas the lower layer 104b may be SiON. An opening 108 has been created through the photoresist layer 106 via patterning, selectively exposing the hard mask layer 104 below.

In FIG. 1B, the hard mask layer 104 has been etched through the opening 108 in the photoresist layer 106, and the photoresist layer 106 subsequently removed, or stripped. Thus, the polysilicon layer 102 is exposed through the opening 108 that now extends through the hard mask layer 104. The polysilicon layer 102 can now be patterned, so that it, too, has a trench or hole corresponding to the opening 108. The etching of the hard mask layer 104 can sometimes undesirably result in the creation of a defect particle 110 within the opening 108, however. The defect particle 110 is usually embedded within the polysilicon layer 102. It may be made up of the material of the hard mask layer 104 and/or the material of the polysilicon layer 102.

The defect particle 110 is particularly disadvantageous because subsequent etching of the polysilicon layer 102 will result in the creation of a polysilicon bridge, meaning that the polysilicon layer 102 has been etched improperly. This is shown in FIG. 1C. Desirably, etching of the polysilicon layer 102 results in extension of the opening 108 over the indicated width 114. However, because the particle 110 partially blocks exposure of the polysilicon layer 102 through the opening 108, etching of the polysilicon layer 102 actually results in extension of the opening 108 over only the indicated width 112. An undesired polysilicon bridge 116 thus results.

The presence of such undesired polysilicon bridges ultimately reduces semiconductor device yield during device fabrication, which can be costly to the semiconductor foundry. The defect particle 110 is therefore desirably eliminated prior to polysilicon etching, between FIGS. 1B and 1C. Current approaches utilize APM cleaning and megasonic vibration. APM cleaning usually employs an ammonium hydroxide, hydrogen peroxide, and water mixture, which, along with megasonic vibration, removes the defect particle 110. However, this approach is itself disadvantageous, resulting in gate oxide integrity (GOI) failure.

Therefore, there is a need for another approach to remove defect particles from polysilicon surfaces that result from hard mask etching. Desirably such removal approach should not cause GOI failure, as APM cleaning and megasonic vibration do. For these reasons, as well as other reasons, there is a need for the present invention.

SUMMARY OF THE INVENTION

The invention relates to the removal of defect particles that may be created during polysilicon hard mask etching, and that are embedded within the polysilicon layer. Oxide is first grown in the polysilicon layer exposed through the patterned hard mask layer, so that the defect particle becomes embedded within the oxide. Oxide growth may be accomplished by rapid thermal oxidation (RTO). The oxide is then exposed to an acidic solution, such as hydrofluoric (HF) acid, to remove the oxide and the embedded defect particle embedded therein.

Embodiments of the invention provide for advantages not found within the prior art. The oxide growth and acidic solution exposure approach removes defect particles that may be created during polysilicon hard mask etching, without gate oxide integrity (GOI) failure. The semiconductor device yield reduction of the prior art, which may be as great as five percent or more, is thus regained. Still other aspects, embodiments, and advantages of the invention will become apparent by reading the detailed description that follows, and by referring to the accompanying figures.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Furthermore, whereas the invention is substantially described in relation to "a" defect particle, this nomenclature is used illustratively only, and is not meant to limit the invention to situations where only a single defect particle is created. That is, the claim language "a defect particle" is inclusive of the situation where one or more defect particles are created. Thus, the claim language "a defect particle" is inclusive of the situation where two, three, or more defect particles are created.

Figure 1A:
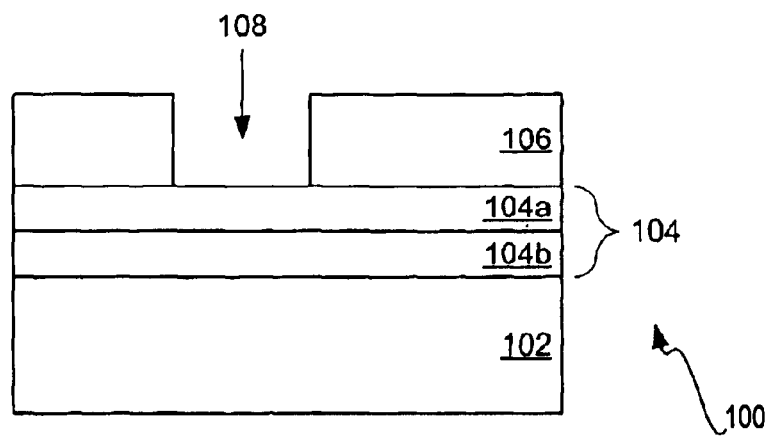
FIGS. 1A, 1B, and 1C are diagrams illustratively showing the creation of a defect particle during polysilicon hard mask etching, resulting in the creation of a polysilicon bridge during subsequent polysilicon etching, according to the prior art.
Figure 1B:
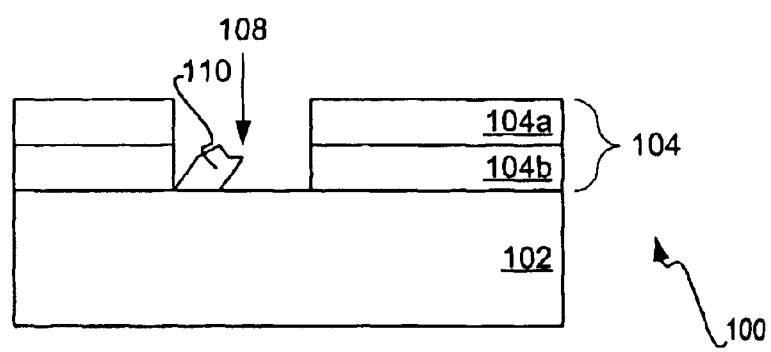
Figure 1C:
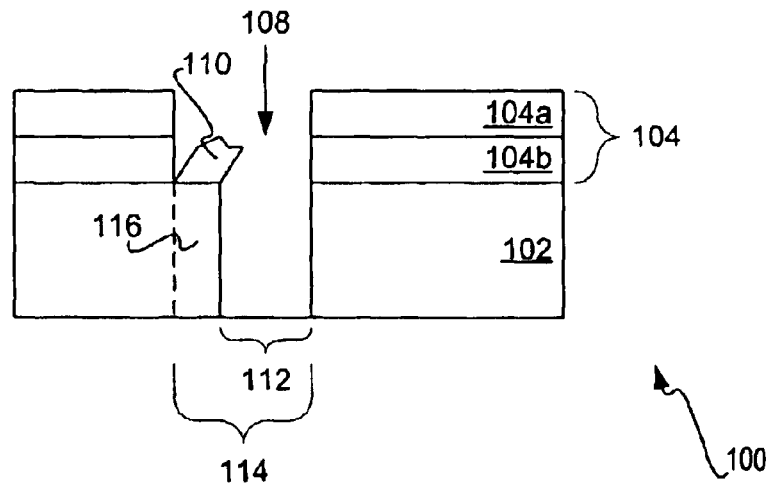
Figure 2:
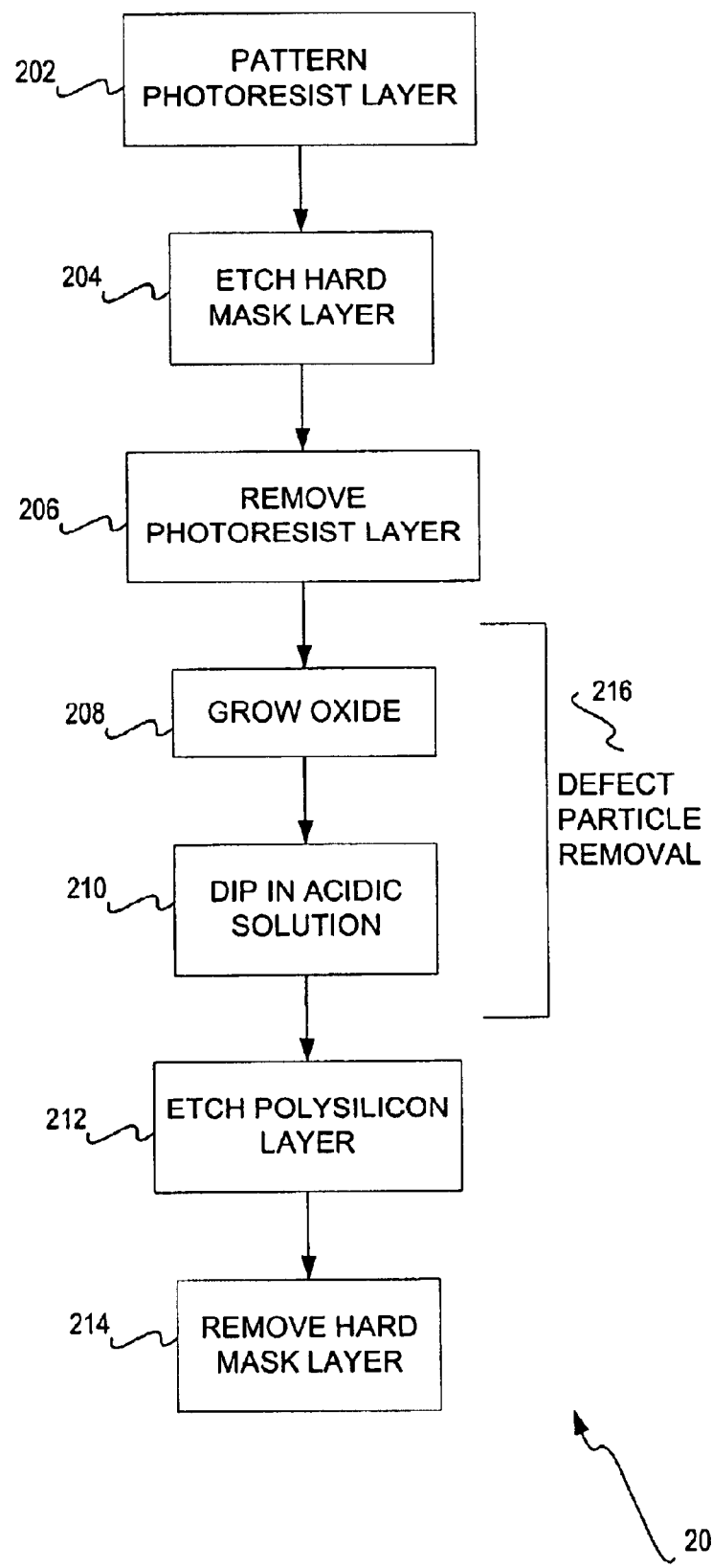
FIG. 2 is a flowchart of a method for fabricating a semiconductor device, including removal of the defect particle that may be created during polysilicon hard mask etching, according to an embodiment of the invention.

FIG. 2 shows a method 200 according to an embodiment of the invention. The method 200 can be used at least in part to fabricate a semiconductor device according to an embodiment of the invention. Parts of the method 200 may also be used to remove defect particles that may be created during polysilicon hard mask etching, as will be more specifically described.

Figure 3A:
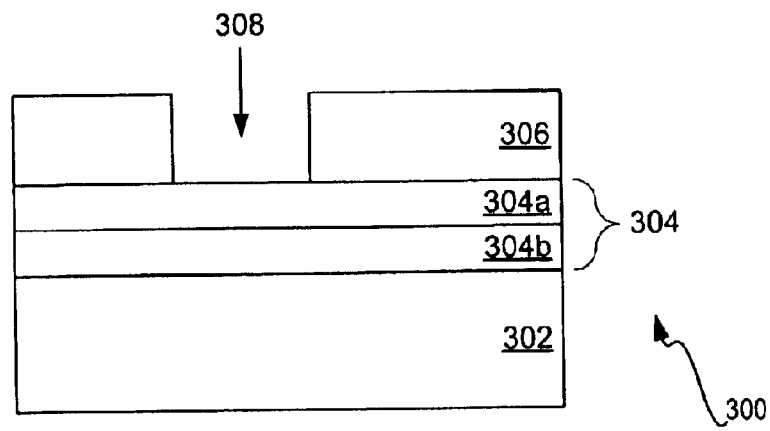
FIGS. 3A, 3B, 3C, 3D, and 3E are diagrams illustratively showing the performance of the method of FIG. 2, according to an embodiment of the invention.

First, a photoresist layer of a semiconductor wafer is patterned according to a desired semiconductor layout (202). This is shown in FIG. 3A. The semiconductor device 300 includes a polysilicon layer 302, a hard mask layer 304, and a photoresist layer 306. The hard mask layer 304 includes an upper layer 304a and a lower layer 304b. Different materials may be used for either of the upper layer 304a and the lower layer 304b. However, in one embodiment, the upper layer 304a is oxide ($SiO_2$), and the lower layer 304b is SiON. The photoresist layer 306 has been patterned, such that it has a trench, opening, or hole 308, through which the hard mask layer 304 is exposed.

Figure 3B:
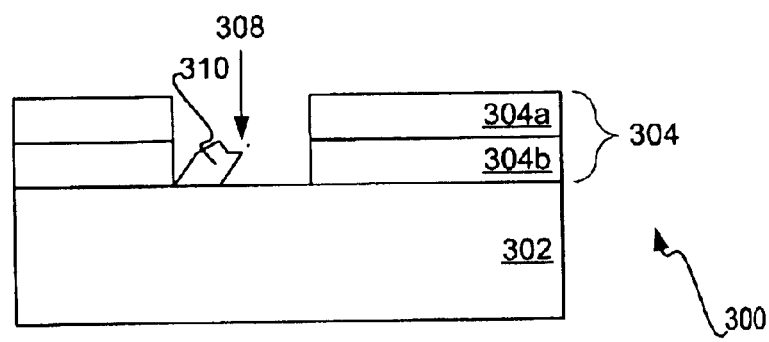

Referring back to FIG. 2, the hard mask layer is etched as it is exposed through the photoresist layer (204). The hard mask layer etching may result in the creation of one or more defect particles, as has been described. The photoresist layer is then removed (206), such as by stripping. Thus, in FIG. 3B, the hard mask layer 304 has the hole 308 extending therethrough, such that the polysilicon layer 302 is exposed through the hard mask layer 304. The process of hard mask etching has resulted in the creation of a defect particle 310, which may be embedded in the polysilicon layer 302. The defect particle 310, as has been described, may have constituent materials including some of the hard mask layer, some of the polysilicon layer, and so on.

Figure 3C:
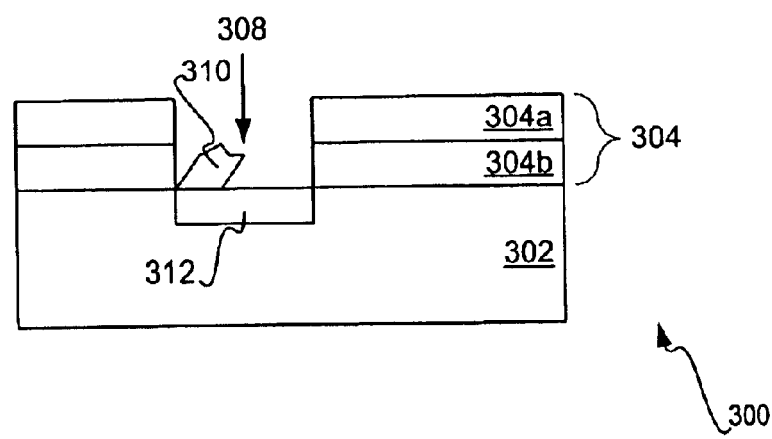

Referring back to FIG. 2, the defect particle is removed (216). This includes first growing oxide within the exposed polysilicon (208). As shown in FIG. 3C, for instance, the oxide 312 is grown. The oxide may be grown by using a rapid thermal oxidation (RTO) process. The oxide is specifically grown within the exposed polysilicon layer 302 through the hole 308, including the polysilicon layer 302 underneath the defect particle 310. In one embodiment, the RTO process is performed by exposing the device 300 to a temperature of 700° C. for substantially thirty seconds. The defect particle 310 previously embedded in the polysilicon layer 302 thus is now preferably embedded within the oxide 312 that has been grown.

Figure 3D:
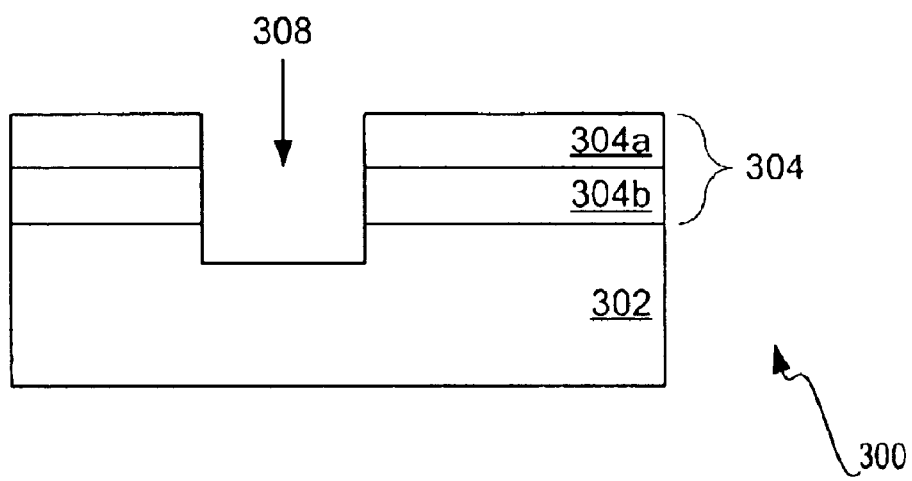

Referring back to FIG. 2, the semiconductor wafer is then preferably exposed to an acidic solution by dipping the wafer therein (210), to remove the oxide and the defect particle. The acidic solution may be a hydrofluoric (HF) acid solution, in a concentration of 1:100 as compared to water. Exposure time may be substantially thirty seconds. This is shown by example in FIG. 3D. In FIG. 3D, the oxide 312 of FIG. 3C that has been grown, and the defect particle 310 created in FIG. 3B and that became embedded in the oxide 312 in FIG. 3C, are no longer present. The acidic solution dipping is an isotropic etching process. Therefore, some of the polysilicon layer 302 may be removed as well. However, only 10–20 Angstrom is likely to be removed, which is negligible where the width of the hole 308 is 1300 Angstrom, for instance.

Figure 3E:
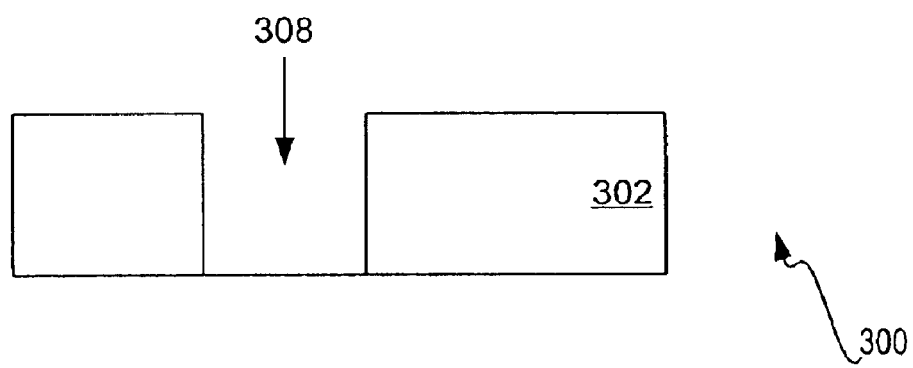

Referring back to FIG. 2, the polysilicon layer is now etched (212) so that it has a hole, trench, or opening, consistent with the hole etched through the photoresist layer and the hard mask layer. Because the defect particle has been removed, no undesirable polysilicon bridges result. Finally, the hard mask layer is removed (214). As shown in FIG. 3E, therefore, the semiconductor device 300 being fabricated on the semiconductor wafer includes the polysilicon layer 302 with the hole 308 therethrough with the desired width, and with no polysilicon bridges.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for removing a defect particle created during polysilicon hard mask etching, comprising:
   growing oxide within a polysilicon layer exposed through a patterned hard mask layer to embed; the defect particle within the oxide, the defect particle created during hard mask etching of the polysilicon layer and originally embedded within the polysilicon layer; and,
   exposing the oxide to an acidic solution to remove the oxide, including the defect particle embedded within the oxide.

2. The method of claim 1, wherein growing the oxide comprises employing a rapid thermal oxidation (RTO) process.

3. The method of claim 2, wherein employing the RTO process comprises exposing a semiconductor wafer including the patterned hard mask layer and the silicon-based layer to a temperature of substantially 700° C. for substantially thirty seconds.

4. The method of claim 1, wherein exposing the oxide to the acidic solution comprises exposing the oxide to a hydrofluoric (HF) acidic solution.

5. The method of claim 4, wherein exposing the oxide to the HF acidic solution comprises dipping a semiconductor wafer including the patterned hard mask layer and the silicon-based layer into the HF acidic solution for substantially thirty seconds.

6. The method of claim 4, wherein exposing the oxide to the HF acidic solution comprises exposing the oxide to a substantially 100:1 water:HF acid solution.

7. The method of claim 1, further initially comprising etching the hard mask layer through a patterned photoresist layer to pattern the hard mask layer.

8. The method of claim 7, further initially comprising patterning the photoresist layer prior to etching the hard mask layer.

9. The method of claim 7, further initially comprising removing the photoresist layer after etching the hard mask layer.

10. The method of claim 1, further comprising etching the polysilicon layer through the patterned hard mask layer.

11. The method of claim 10, further comprising removing the hard mask layer.

12. The method of claim 1, wherein the hard mask layer comprises an upper layer and a lower layer.

13. The method of claim 12, wherein the upper layer comprises a SiO2 layer.

14. The method of claim 12, wherein the lower layer comprises a SiON layer.

15. A method for removing a defect particle created during silicon-based hard mask etching, comprising:

growing oxide within a polysilicon layer exposed through a patterned hard mask layer via rapid thermal oxidation (RTO) to embed; the defect particle within the oxide, the defect particle created during hard mask etching of the polysilicon layer and originally embedded within the polysilicon layer; and, exposing the oxide to a hydrofluoric (HF) acidic solution to to remove the oxide, including the defect particle embedded within the oxide.

16. The method of claim 15, wherein growing the oxide in the polysilicon layer via the RTO comprises exposing a semiconductor wafer including the patterned hard mask layer and the polysilicon layer to a temperature of substantially 700° C. for substantially thirty seconds.

17. The method of claim 15, wherein exposing the oxide to the HF acidic solution comprises dipping a semiconductor wafer including the patterned hard mask layer and the polysilicon layer into the HF acidic solution for substantially thirty seconds.

18. The method of claim 15, wherein exposing the oxide to the HF acidic solution comprises exposing the oxide to a substantially 100:1 water:HF acid solution.

19. The method of claim 15, wherein the hard mask layer comprises an upper SiO2 layer and a lower SiON layer.

20. A semiconductor device fabricated at least in part by a method comprising:

patterning a photoresist layer over a hard mask layer over a polysilicon layer;

etching the hard mask layer through the patterned photoresist layer to correspondingly pattern the hard mask layer, and resulting in one or more defect particles embedded in the polysilicon layer exposed through the patterned hard mask layer;

removing the photoresist layer;

growing oxide in the polysilicon layer exposed through the patterned hard mask layer to embed the one or more defect particles created during hard mask etching of the polysilicon layer in the oxide;

exposing the oxide to an acidic solution to remove the oxide, including the one or more defect particles embedded within the oxide;

etching the polysilicon layer through the patterned hard mask layer; and, removing the hard mask layer.

* * * * *